United States Patent [19]
Saotome et al.

[11] Patent Number: 5,812,031
[45] Date of Patent: Sep. 22, 1998

[54] RING OSCILLATOR HAVING LOGIC GATES INTERCONNECTED BY SPIRAL SIGNAL LINES

[75] Inventors: Makoto Saotome; Mika Misawa, both of Kawasaki, Japan

[73] Assignee: Fujitsu Limited, Kawasaki, Japan

[21] Appl. No.: 744,044

[22] Filed: Nov. 6, 1996

[51] Int. Cl.$^6$ .............................. H03B 5/02; H01L 23/528
[52] U.S. Cl. ........................ 331/57; 331/108 C; 257/773; 257/776
[58] Field of Search ................................. 331/57, 108 C, 331/108 D; 257/773, 776

[56] References Cited

U.S. PATENT DOCUMENTS

| | | | |
|---|---|---|---|
| 4,079,338 | 3/1978 | Kronlage | 331/57 |
| 5,334,866 | 8/1994 | Kubo | 257/773 |

*Primary Examiner*—Siegfried H. Grimm
*Attorney, Agent, or Firm*—Staas & Halsey

[57] ABSTRACT

A ring oscillator circuit of one aspect includes a plurality of logic gates connected in cascade in a ring form and a plurality of signal lines each disposed between adjacent ones of the plurality of logic gates, and one of the signal lines is disposed in a spiral form in a pair together with another signal line. A ring oscillator circuit of another aspect includes a plurality of logic gates connected in cascade in a ring form and a plurality of signal lines whose wiring layout is made using wiring layers of a multi-layer structure and which are disposed between adjacent ones of the plurality of logic gates, and one of the signal lines is disposed spirally in such a manner as to be close to itself at portions thereof in at least two of the wiring layers of a multi-layer structure. When such a layout of the signal lines is employed, the difference between the frequency of the pulses actually output and the frequency of the output pulses based on simulation can be reduced to minimum.

9 Claims, 5 Drawing Sheets

RING OSCILLATOR HAVING LOGIC GATES INTERCONNECTED BY SPIRAL SIGNAL LINES

BACKGROUND OF THE INVENTION

1. Field of the Invention

This invention relates to a ring oscillator circuit having a plurality of logic gates connected in cascade in a ring form. More particularly, this invention relates to a layout technology of signal lines (wiring) between the logic gates that constitute the ring oscillator circuit.

Such a ring oscillator circuit has been widely used in information processing units and communication-related equipment. For example, one application is to generate pulses having a desired frequency and operate other circuits using the pulses (e.g. burn-in test). Another application is to assemble the ring oscillator circuit into an electrical circuit independent of other circuits, operate the ring oscillator circuit at the time of an initial test and estimate an overall operation speed of the electrical circuit based on the frequency of the output pulses. In the latter case, operation simulation is carried out for the ring oscillator circuit.

2. Description of the Related Art

In a typical ring oscillator circuit, as shown in FIG. 1, three NAND gates 1, 2 and 3 are connected in cascade in a ring form. In the illustrated example, the output of a final stage gate (NAND gate 3) forms an output signal OUT of the ring oscillator circuit, and this output signal OUT is fed back to one of the input terminals of an initial stage gate (NAND gate 1). An input signal IN for bringing this ring oscillator circuit to an enable state or a disable state is applied to the other input terminal of the initial stage gate 1, and a high potential power source voltage Vdd is applied to the other input terminal of each of the next stage gate 2 and the final stage gate 3. Therefore, when a signal having a logically high level ("H" level) is applied as the input signal IN, each of the gates 1, 2 and 3 functions as an inverter, so that the ring oscillator is brought into the enable state and can conduct the oscillation operation. On the other hand, when a signal having a logically low level ("L" level) is applied as the input signal IN, the output of the initial stage gate 1 is fixed at the "H" level and eventually, the output signal OUT, too, is fixed at the "H" level. In consequence, the ring oscillator circuit enters the disable state.

In FIG. 1, symbols $L_1$, $L_2$ and $L_3$ denote a signal line (wiring) extending from the output terminal of the initial gate 1 to the input terminal of the next stage gate 2, a signal line (wiring) extending from the output terminal of the next stage gate 2 to the input terminal of the final stage gate 3 and a signal line (wiring) extending from the output terminal of the final stage gate 3 to the input terminal of the initial stage gate 1, respectively. Each signal line $L_1$, $L_2$, $L_3$ has a wiring resistance and a wiring capacitance corresponding to each wiring length. Therefore, the frequency of the output pulse generated from the ring oscillator circuit can be adjusted by changing the wiring capacitance (that is, the wiring length) of each signal line.

When such a ring oscillator circuit is assembled into an electrical circuit and is used, several ring oscillator circuits having different wiring capacitances are assembled into the electrical circuit so that pulse trains having a variety of frequencies can be generated. In this case, a ring oscillator circuit, each signal line of which has a large wiring capacity, must be used when it is desired to generate pulses having particularly low frequencies or to estimate the speed of a data bus having a long wiring length.

However, to increase the wiring capacitance of each signal line, the wiring length must be increased. As a result, a problem occurs in that the area occupied by the ring oscillator circuit on the electrical circuit becomes relatively large. In view of this, a layout design which efficiently positions each signal line (wiring) of the ring oscillator circuit and minimizes the area occupied is essentially required.

As one conventional technique to cope with this, a technique which disposes a signal line between adjacent logic gates (the signal line $L_2$ between the NAND gates 2 and 3 in the illustrated example) in a spiral form, as shown in FIG. 2, is known.

This layout design is advantageous in the respect of minimization of the occupation area. However, because the signal line is disposed singly between the adjacent logic gates, the wiring capacitance cannot be always increased, although the wiring length can be certainly increased. As a result, a problem occurs in that the output pulse of a lower frequency cannot be effectively generated.

The self capacitance between wiring, or in other words, between adjacent portions of a single signal line, always exists in a signal line between practical logic gates, and this value can be never neglected. However, because the conventional technique conducts a simulation using a net list which does not take into consideration wiring resistance, this self capacitance between the wiring has been dealt with as being absent. As a result, a difference arises between the frequency of the output pulses based on the simulation and the frequency of the pulses that are actually output. This results in a problem that the operating speed of the electrical circuit incorporating the ring oscillator circuits cannot be correctly evaluated.

SUMMARY OF THE INVENTION

It is a main object of the present invention to provide a ring oscillator circuit which can reduce the difference between the frequency of pulses practically output and the frequency of output pulses based on simulation to a minimum.

It is another object of the present invention to provide a ring oscillator circuit which can secure a signal delay time with the possible smallest occupied area and thus generate pulses at a lower frequency.

According to one aspect of the present invention, there is provided a ring oscillator circuit including a plurality of logic gates connected in cascade in a ring form, and a plurality of signal lines each disposed between adjacent ones of the logic gates, at least one of the signal lines forming a pair with another signal line and being disposed spirally.

According to another aspect of the present invention, there is provided a ring oscillator circuit including a plurality of logic gates connected in cascade in a ring form, and a plurality of signal lines each disposed between adjacent ones of the plurality of logic gates and whose wiring layout is made using wiring layers of a multi-layer structure, at least one of the signal lines being disposed spirally in such a manner as to be adjacent to itself in at least two of the wiring layers of a multi-layer structure.

According to still another aspect of the present invention, there is provided a semiconductor circuit including the ring oscillator circuit of any of the aspects described above, and a plurality of external terminals used for controlling an operation of the ring oscillator circuit and detecting its operation waveform.

BRIEF DESCRIPTION OF THE DRAWINGS

These and other structural features of the present invention will become more apparent from the following detailed description when taken in conjunction with the accompanying drawings, wherein.

DESCRIPTION OF THE PREFERRED EMBODIMENTS

Figure 3:
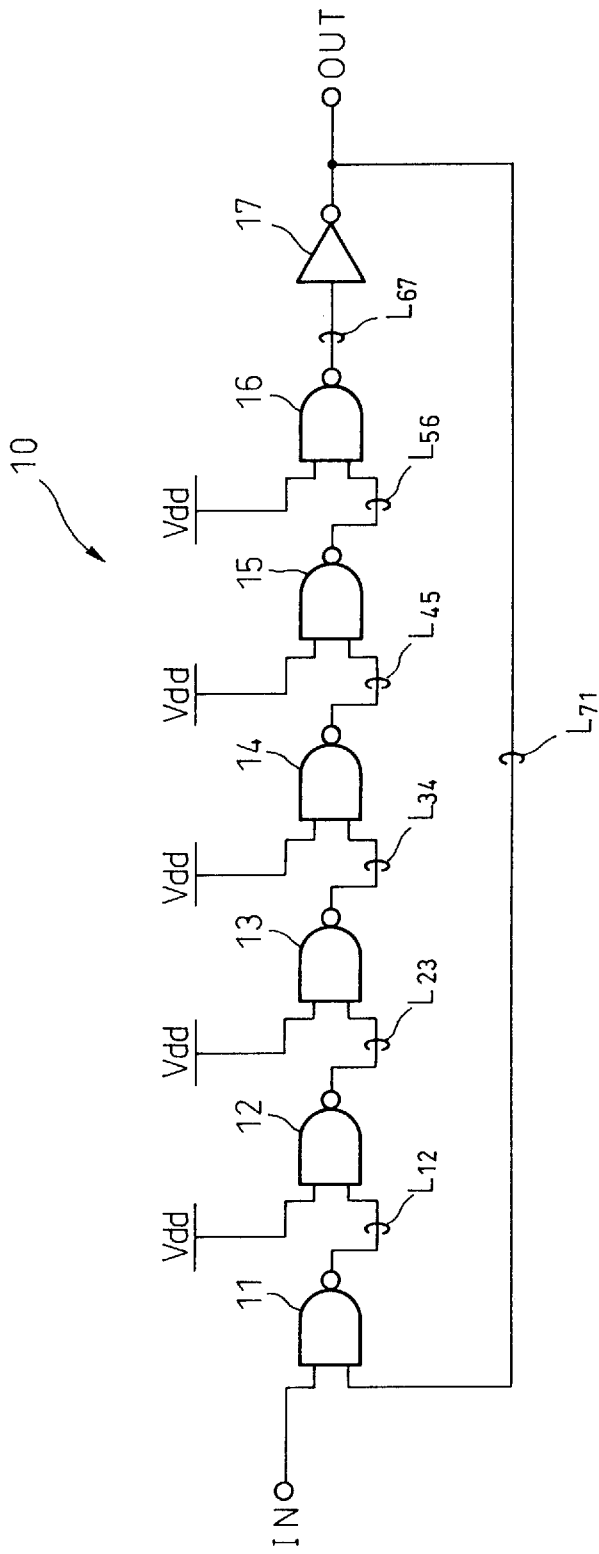
FIG. 3 is a circuit diagram showing the constitution of a ring oscillator circuit according to an embodiment of the present invention.

FIG. 3 shows the constitution of a ring oscillator circuit according to an embodiment of the present invention.

As shown in this diagram, the ring oscillator circuit 10 of this embodiment comprises six NAND gates 11 to 16 and one inverter gate (hereinafter simply called the "inverter") 17 that are cascaded with one another in a ring form. In this circuit constitution, the output of the final stage gate (inverter 17) generates an output signal OUT of the ring oscillator circuit 10, and is fed back to one of the input terminals of the initial stage gate (NAND gate 11). An input signal IN which brings the ring oscillator circuit 10 into the enable state or the disenable state is applied to the other input terminal of this NAND gate 11, and a power source voltage Vdd having a high potential (3.3 V in this embodiment) is applied to the other input terminal of each of the other NAND gates 12 to 16. Therefore, when the input signal IN is at an "H" level, all the gates 11 to 17 function as the inverters. Therefore, the ring oscillator circuit 10 is under the enable state. When the input signal IN is at an "L" level, the output of the initial stage gate 11 is fixed to the "H" level, and the output signal OUT, too, is eventually fixed to the "H" level. Therefore, the ring oscillator circuit 10 is under the disenable state.

Symbols $L_{12}$, $L_{23}$, $L_{34}$, $L_{45}$, $L_{56}$, $L_{67}$ and $L_{71}$ denote signal lines (wiring) disposed between adjacent gates. As will be later described, each signal line $L_{12}$, $L_{23}$, $L_{34}$, $L_{45}$, $L_{56}$, $L_{67}$ and $L_{71}$ is disposed in a specific layout pattern so that each has a predetermined wiring resistance and a predetermined wiring capacitance (refer to FIGS. 4 and 5).

Figure 4:
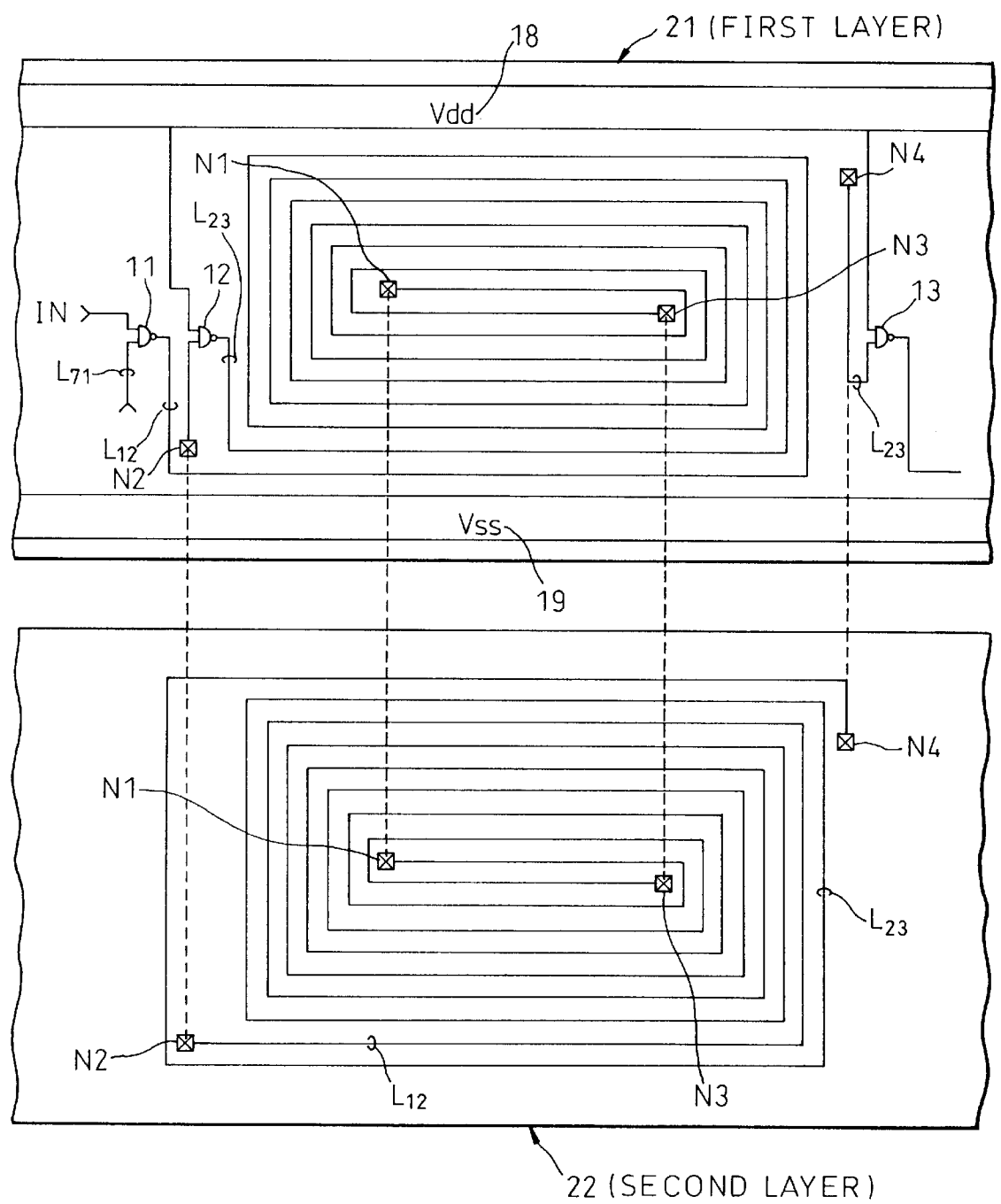
FIG. 4 is a diagram schematically showing an example of the signal wiring layout in the ring oscillator circuit shown in FIG. 3.

FIG. 4 typically shows an example of the layout of the signal wiring. In the example shown in the drawing, each layout pattern is shown for each of the signal line $L_{12}$ extending from the output terminal of the initial stage gate (NAND gate 11) to the input terminal of the NAND gate 12 of the next stage and the signal line $L_{23}$ extending from the output terminal of this NAND gate 12 to the input terminal of the NAND gate 13 of the next stage.

The wiring layout shown in FIG. 4 is attained by using a wiring layer having a two-layered structure (i.e. a first wiring layer 21 positioned on the lower side and a second wiring layer 22 position on the upper side). The first wiring layer 21 is made of tungsten (W) and the second wiring layer 22 is made of aluminum (Al) or copper (Cu). Therefore, the resistance value per unit length of the signal line disposed on the first wiring layer 21 is greater than the resistance value per unit length of the signal line disposed on the second wiring layer 22. The pattern width of the wiring pattern of each signal line is about 0.9 μm and the pattern gap is about 1.6 μm in this embodiment. By the way, reference numeral 18 denotes a wiring pattern for the high potential power source voltage Vdd and reference numeral 19 denotes a wiring pattern for the low potential power source voltage Vss (0 V in this embodiment).

As shown in FIG. 4, the signal lines $L_{12}$ and $L_{23}$ are spirally disposed, and are electrically connected between the first wiring layer 21 and the second wiring layer 22 through via-holes (contact holes) N1 to N4. Since the wiring layout is made spirally in this way, the occupying area of the ring oscillator 10 can be reduced as a whole.

The signal line $L_{12}$ extending from the initial stage gate 11 is so disposed as to form a pair with another signal line (the signal line $L_{23}$ extending from the next stage gate 12 in the embodiment shown). Therefore, the wiring self capacitance when viewed from one of the signal lines $L_{12}$ (or $L_{23}$) can be made smaller than that of the means which disposes only one signal line in the spiral form as in the prior art (see FIG. 2). As a result, the difference between the frequency of the output pulse based on simulation and the frequency of the pulse actually outputted can be reduced to minimum.

The signal lines $L_{12}$ and $L_{23}$ so disposed as to form a pair have mutually opposite logic levels (that is, one of them has the "L" level when the other has the "H" level). Therefore, the potential difference between the wirings of these signal lines becomes greater than when the signal lines do not have such a relation. In consequence, a greater wiring capacitance can be secured, and low frequency pulses can be effectively generated.

Further, this wiring layout is carried out by using the first wiring layer 21 having a relatively higher resistance at the portion in the proximity of the output terminal of each driver, that is, each NAND gate, while the wiring layout is carried out by using the second wiring layer 22 having a relatively lower resistance at the portion spaced apart from the output terminal of each driver. In this way, the propagation delay time of the signal passing through each gate can be increased, and this greatly contributes to the effective generation of low frequency pulses.

Since the signal lines $L_{12}$ and $L_{23}$ are disposed spirally in such a manner as to form a pair, a sufficient length can be secured for the wiring length of each signal line, and a sufficient margin can be secured between the timing at which the potential of the signal line $L_{12}$ changes (from the "H" level to the "L" level or vice versa) and the timing at which the potential of the signal line $L_{23}$ changes (from the "L" level to the "H" level or vice versa). In other words, the potential of each signal line $L_{12}$, $L_{23}$ can be switched under the stable state, and this contributes to a reduction in the difference between the frequency of the output pulses based on simulation and the frequency of the pulses actually outputted.

Figure 5:
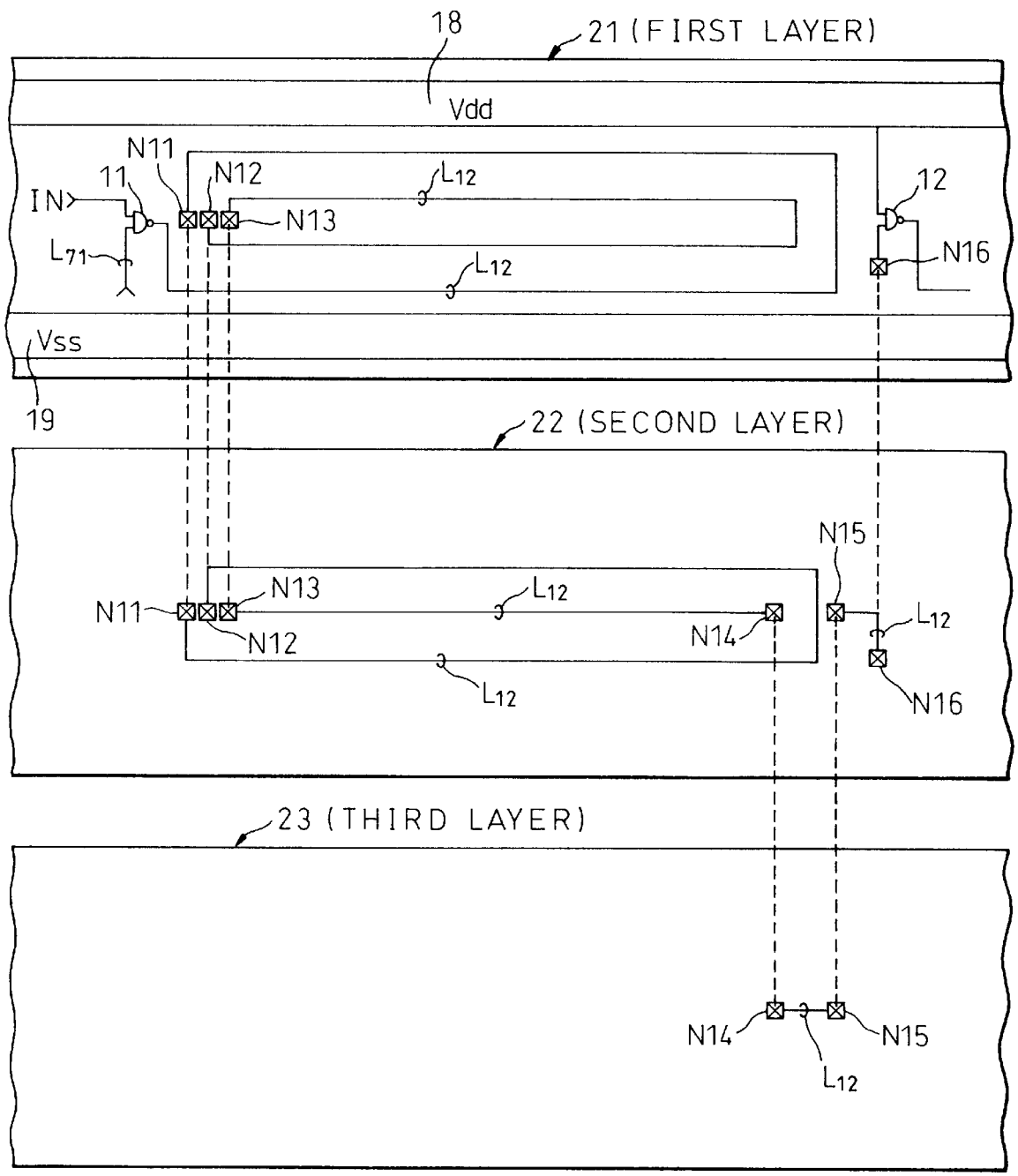
FIG. 5 is a diagram schematically showing another example of the signal wiring layout in the ring oscillator circuit shown in FIG. 3.

FIG. 5 typically shows another example of the layout of the signal wiring. In the example shown in this drawing, the layout pattern of the signal line $L_{12}$ extending from the output terminal of the initial gate (NAND gate 11) to the input terminal of the NAND gate 12 of the next stage is illustrated.

The wiring layout shown in FIG. 5 is carried out by using the wiring layers having a three-layered structure (a first wiring layer 21 disposed on the lower side, a second wiring layer 22 disposed on the first wiring layer 21, and a third wiring layer 23 disposed on the second wiring layer 22). In this embodiment, the material of each wiring layer is not specifically limited, and the pattern width of the wiring pattern of each signal line is about 0.9 µm and the pattern gap is about 3.2 µm.

In the example shown in FIG. 5, the signal line $L_{12}$ is disposed spirally and close to itself, and the signal line is electrically connected to itself through via-holes (contact holes) N11 to N16 among the wiring layers 21 to 23.

Therefore, this wiring layout in the spiral form can reduce the overall area occupied by the ring oscillator circuit 10 in the same way as in the embodiment shown in FIG. 4.

Figure 1:
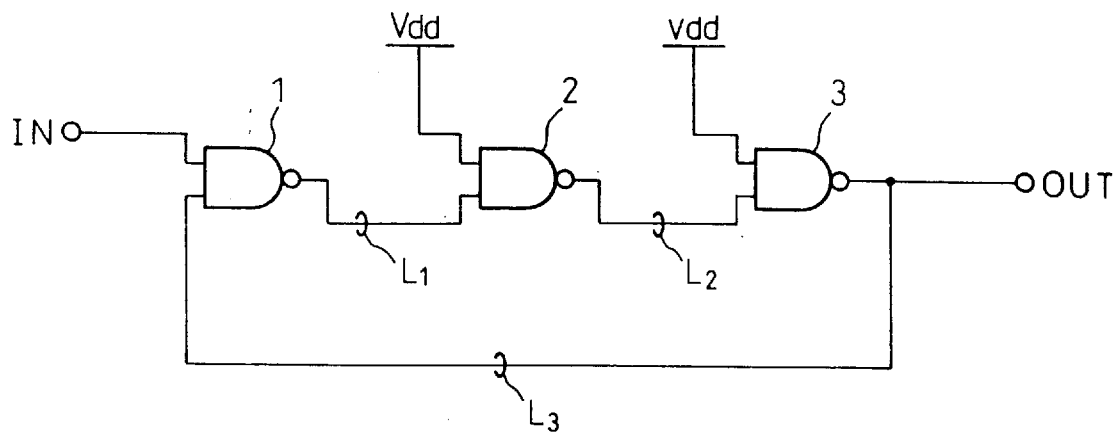
FIG. 1 is a circuit diagram showing the constitution of a typical ring oscillator circuit.
Figure 2:
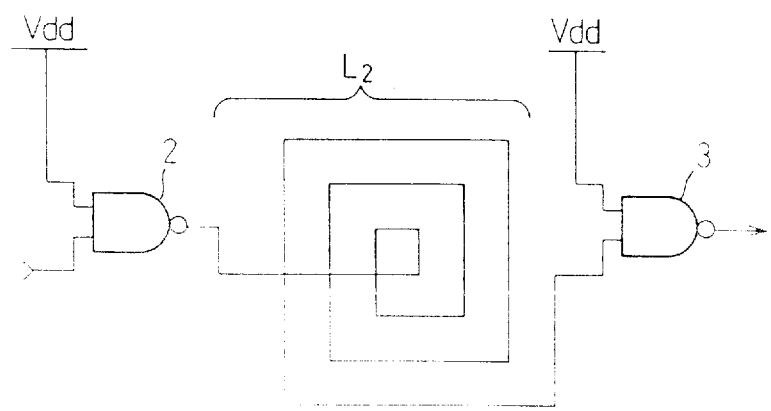
FIG. 2 is a diagram showing an example of the signal wiring layout in a prior art ring oscillator circuit.

Since the signal line $L_{12}$ is disposed close to itself in the three-layered structure, the capacitance between the wiring can be made smaller than when the signal line is disposed in the same wiring layer as in the prior art (see FIG. 2). In this way, the difference between the frequency of the output pulses based on simulation and the frequency of the pulses actually outputted can be reduced to minimum.

Figure 6:
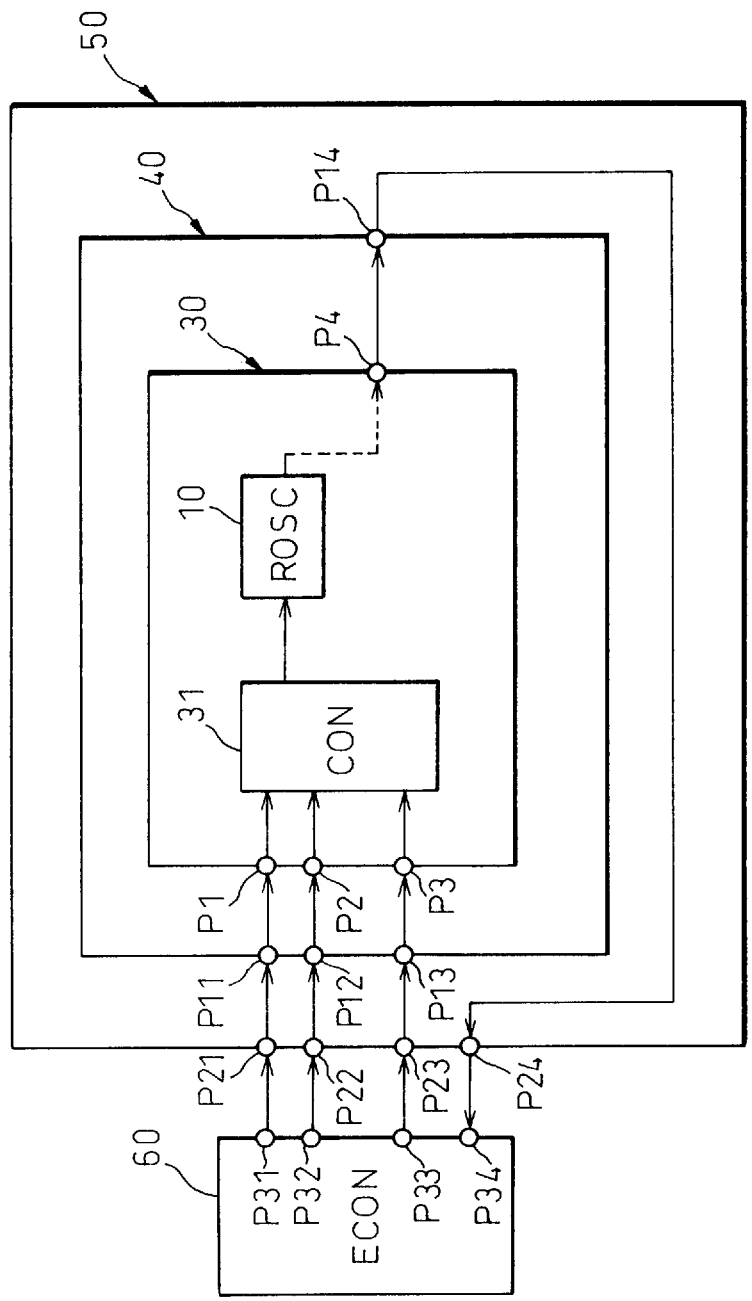
FIG. 6 is a block diagram showing an application example of the ring oscillator circuit shown in FIG. 3.

FIG. 6 schematically shows an application example of the ring oscillator circuit 10 of this embodiment.

As shown in the drawing, the ring oscillator circuit (ROSC) 10 of this embodiment is assembled into a semiconductor circuit having a chip form such as a CMOS circuit 30, and is controlled by a controller (CON) 31 according to the JTAG which is likewise assembled in the CMOS circuit 30. The controller 31 and the ring oscillator circuit 10 are connected to the outside through external terminals (input/output pins) P1 to P4. The CMOS circuit 30 is mounted with other semiconductor circuits, not shown, to a printed board 40, and is connected to corresponding external terminals (input/output pins) P11 to P14 disposed on the printed board 40, through the external terminals P1 to P4. This printed board 40 is assembled into a test system with other printed boards, and is connected to corresponding external terminals (input/output pins) P21 to P24 disposed on the test system 50, through the external terminals P11 to P14. This test system 50 is connected through its external terminals P21 to P24 to the corresponding output terminals (input/output pins) P31 to P34 of an external controller (ECON) 60 incorporating therein an interface for controlling, from outside, this test system.

In this circuit constitution, when necessary control signals are appropriately supplied to the controller 31 incorporated in the CMOS circuit 30 mounted to the printed board 40 inside the test system 50, from the external controller 60, the operation of the ring oscillator 10 can be controlled. Further, since the output pulse waveform of this ring oscillator circuit 10 is fed back to the external controller 60, the operation speed of the CMOS circuit assembling therein the ring oscillator circuit 10 can be estimated as a whole.

In the foregoing embodiments, the explanation has been given on the case where the NAND gates are used as the logic gates constituting the ring oscillator circuit 10, but the kind of the logic gates is not limited thereto. In short, the gates may be of such a type which can function as the inverter when the circuit is brought into the enable stage. Therefore, the ring oscillator circuit can be constituted by using the NOR gates, for example. In this case, however, the low potential power source voltage Vss must be applied to one of the input terminals of the NOR gate (see FIG. 3).

What is claimed is:

1. A ring oscillator circuit comprising:
   a plurality of logic gates connected in cascade in a ring form; and
   a plurality of signal lines each disposed between adjacent logic gates of said plurality of logic gates,
   one of said plurality of signal lines being disposed in a spiral form in a pair together with another signal line.

2. The ring oscillator circuit according to claim 1, wherein two signal lines disposed in a spiral form in said pair have potentials of mutually opposite logical levels.

3. The ring oscillator circuit according to claim 1, wherein, when a wiring layout of said plurality of signal lines is made using wiring layers of a multi-layer structure, at least one of said plurality of signal lines is formed such that a signal line portion lying in the proximity of an output terminal of a logic gate whose output terminal is connected to said at least one signal line is formed in a wiring layer having a relatively higher resistance among said wiring layers of a multi-layer structure, and such that the remaining signal line portion is formed in a wiring layer having a relatively lower resistance among said wiring layers of a multi-layer structure.

4. The ring oscillator circuit according to claim 1, wherein, with respect to successive first, second and third logic gates, a wiring length of each of said plurality of signal lines is selected sufficiently so long that a sufficient time margin can be obtained between a timing at which the potential of a signal line disposed between said first and second logic gates is changed from a first logic level to a second logic level and a timing at which the potential of a signal line disposed between said second and third logic gates is changed from the second logic level to the first logic level.

5. A ring oscillator circuit comprising:
   a plurality of logic gates connected in cascade in a ring form; and
   a plurality of signal lines each disposed between adjacent logic gates of said plurality of logic gates, and whose wiring layout is made using wiring layers of a multi-layer structure,
   one of said plurality of signal lines being disposed in a spiral form in such a manner as to be close to itself at portions thereof in at least two of said wiring layers of a multi-layer structure.

6. The ring oscillator circuit according to claim 1, wherein each of said plurality of logic gates is a gate that functions as an inverter when said ring oscillator circuit is brought to an enable state.

7. The ring oscillator circuit according to claim 5, wherein each of said plurality of logic gates is a gate that functions as an inverter when said ring oscillator is brought to an enable state.

8. A semiconductor circuit comprising a ring oscillator circuit and a plurality of external terminals used for controlling an operation of said ring oscillator circuit and detecting its operation waveform, said ring oscillator circuit including a plurality of logic gates connected in cascade in a ring form, and a plurality of signal lines each disposed between adjacent logic gates of said plurality of logic gates, at least one of said plurality of signal lines forming a pair with another signal line and being disposed in a spiral form.

9. A semiconductor circuit comprising a ring oscillator circuit and a plurality of external terminals used for controlling an operation of said ring oscillator circuit and detecting its operation waveform, said ring oscillator circuit including a plurality of logic gates connected in cascade in a ring form, and a plurality of signal lines each disposed between adjacent logic gates of said plurality of logic gates and whose wiring layout is made using wiring layers of a multi-layer structure, one of said plurality of signal lines being disposed in a spiral form in such a manner as to be close to itself at portions thereof in at least two of said wiring layers of a multi-layer structure.

\* \* \* \* \*